US010819140B1

(12) United States Patent
Maalouf et al.

(10) Patent No.: US 10,819,140 B1
(45) Date of Patent: Oct. 27, 2020

(54) SYSTEMS AND METHODS FOR REMOTE MONITORING AND CONTROL OF EMERGENCY ELECTRICAL GENERATING SYSTEMS

(71) Applicant: Mark A. Maalouf, Chevy Chase, MD (US)

(72) Inventors: Mark A. Maalouf, Chevy Chase, MD (US); Ernest B. Henry, Bowie, MD (US)

( * ) Notice: Subject to any disclaimer, the term of this patent is extended or adjusted under 35 U.S.C. 154(b) by 0 days.

(21) Appl. No.: 16/177,369

(22) Filed: Oct. 31, 2018

Related U.S. Application Data

(60) Provisional application No. 62/696,661, filed on Jul. 11, 2018.

(51) Int. Cl.
H02J 9/08 (2006.01)
H02J 9/06 (2006.01)
G01R 31/40 (2020.01)
H02J 13/00 (2006.01)

(52) U.S. Cl.
CPC .............. H02J 9/061 (2013.01); G01R 31/40 (2013.01); H02J 9/08 (2013.01); H02J 13/00 (2013.01); H02J 9/068 (2020.01)

(58) Field of Classification Search
CPC .................................. H02J 9/061; H02J 9/08
USPC ...................................................... 307/64–66
See application file for complete search history.

(56) References Cited

U.S. PATENT DOCUMENTS

| 5,929,781 | A  | * | 7/1999 | Vosika ................. G08B 29/126 |
| | | | | 315/134 |
| 6,172,432 | B1 | | 1/2001 | Schnackenberg et al. |
| 7,362,696 | B2 | | 4/2008 | Ferry et al. |
| 7,402,766 | B1 | * | 7/2008 | Jonas ....................... H01H 9/26 |
| | | | | 200/50.33 |
| 9,122,466 | B1 | | 9/2015 | Kellett et al. |
| 9,935,495 | B2 | | 4/2018 | Thurk et al. |

(Continued)

OTHER PUBLICATIONS

"ASCO 7000 Series Power Monitoring and Control", www.ascopower.com, dated Nov. 14, 2016, pp. 1-6.

(Continued)

Primary Examiner — Adi Amrany
(74) Attorney, Agent, or Firm — Chris D. Thompson

(57) ABSTRACT

A Remote Monitoring and Control System (RMCS) for an electrical power system includes a control/communication module and a test apparatus. The test apparatus includes electrical power system test components electrically coupled in or to an automatic transfer switch of the electrical power system and the control/communication module. The test components are operable by the control/communication module for controlling, monitoring, assessing, and testing one or more functions of the electrical power system. A method of assessing a backup power system includes: coupling electrical power system test components to an automatic transfer switch of the backup power system; communicatively coupling the electrical power system test components to a control/communication module; and operating the electrical power system test components to measure or test conditions in the backup power system. The RMCS can provide seamless 24/7 monitoring coverage and control capabilities to enhance system performance and reliability.

22 Claims, 4 Drawing Sheets

(56) References Cited

U.S. PATENT DOCUMENTS

| | | | | |
|---|---|---|---|---|
| 2004/0124710 A1* | 7/2004 | Pfeiffer | .................... | H02J 9/06 |
| | | | | 307/64 |
| 2008/0182215 A1* | 7/2008 | Sid | ........................ | B60K 28/10 |
| | | | | 431/18 |
| 2010/0013308 A1* | 1/2010 | Lathrop | ................... | H02J 3/14 |
| | | | | 307/64 |
| 2012/0025620 A1* | 2/2012 | Stump | ...................... | H02J 9/08 |
| | | | | 307/80 |
| 2013/0049476 A1* | 2/2013 | Lathrop | ................... | H02J 3/06 |
| | | | | 307/80 |
| 2013/0231793 A1* | 9/2013 | Elliott | ................... | G05B 15/02 |
| | | | | 700/292 |
| 2015/0311843 A1* | 10/2015 | Iles | .......................... | H02P 9/48 |
| | | | | 290/40 B |

OTHER PUBLICATIONS

"ASCO Series 300 Remote ATS Monitoring System", www.ascopower.com, dated Aug. 9, 2016, pp. 1-9.

"Automatic Transfer Switches", Kohler Co., KohlerPower.com, dated 2014, pp. 1-13.

"CRN Cellular Wireless Generator Monitor", www.crnwireless.com, accessed Oct. 9, 2018, p. 1.

"Generator Monitoring", www.crnwireless.com, accessed Oct. 10, 2018, pp. 1-4.

"Mobile Link Wi-Fi Remote Monitoring Installation and User Manual", Generac Power Systems, Inc., dated Apr. 11, 2018, pp. 1-25.

"Remotely monitor and control multiple transfer switches", Eaton Corp., dated Dec. 2011, pp. 1-4.

* cited by examiner

SYSTEMS AND METHODS FOR REMOTE MONITORING AND CONTROL OF EMERGENCY ELECTRICAL GENERATING SYSTEMS

PRIORITY CLAIM

This application claims priority to U.S. Application Ser. No. 62/696,661, entitled "SYSTEMS AND METHODS FOR REMOTE MONITORING AND CONTROL OF EMERGENCY ELECTRICAL GENERATING SYSTEMS", filed Jul. 11, 2018, which is incorporated by reference as if fully set forth herein.

BACKGROUND

Technical Field

The present invention relates to the field of backup electrical power systems. More specifically, embodiments herein relate to systems and methods for monitoring and testing backup electrical power systems that include automatic transfer switches for switching electric power from utility to emergency power in the event of a failure of utility power.

Description of the Related Art

An independent emergency generator system ("IEGS") provides back-up power to a facility when the Utility power is lost. A typical IEGS includes, among other things, an Independent Power Source ("IPS")—typically a generator—and an automatic transfer switch ("ATS"). The ATS is connected to and controls the switching between the Utility and the IPS power sources. When utility voltage or frequency is lost or falls below a certain preset threshold, the system triggers the activation of the IPS and, after confirming acceptable voltage and frequency from the IPS, switches the critical load power supply from the Utility to the IPS.

Since the IEGS provides emergency back-up power to critical loads that sometimes include life safety systems, it is important to ensure that the IEGS operates properly at all times. A problem, however, is that such a reliable on demand performance is difficult to guarantee since an IEGS—by definition—only operates during the (rare) loss of normal Utility power. The issue is further complicated by the fact that the ATS and the IPS have hundreds of moving electro-mechanical parts and components. The few times that the IEGS undergoes scheduled testing—typically during a scheduled preventive maintenance and through weekly automatic self-testing—are not sufficient to guarantee the performance during most other times, most importantly during a power outage. This is particularly true in a residential facility where the self-testing cycle is not consistently or diligently monitored as it is with commercial facilities that are supervised and monitored by dedicated professionals and real-time monitoring systems.

Most existing systems monitor either the IPS or the ATS only while some systems monitor both through a wired or wireless connection between an ATS and an IPS. Such systems are mostly manufacture-specific and often customized for a specific projects and operate through or in communication with the ATSs and/or IPSs' circuit control board.

IPSs, and specifically generators for example, in spite of having a PCB or a communication module or a digital control panel (with self-start timer capability), are considered "dumb" machines, and do not control the IEGS's operation. These "dumb" machines typically have propriety accessories such as wireless monitoring systems which just report on the status of the IPS.

"Standard" ATSs on the other hand, can electro-mechanically control the IEGS's operation; As used herein, "Smart" ATSs are those which can further be programmed to control the IEGS's operation, via a user operated digital control panel.

Smart ATSs cost thousands of dollars and can have equally expensive accessories, including proprietary remote monitoring and control modules which interact with the ATS's digital control panel. In other words, these remotely operated modules perform the exact same tasks that a user-operator would when observing or programming the digital control panel on location.

A need exists for systems and methods for a new wireless remote monitoring and control system that can be seamlessly integrated into any ATS, and effectively turn such ATSs into a new improved smart switch.

SUMMARY

Systems and methods for monitoring and testing electrical power systems having backup power systems with automatic transfer switches are described. In one embodiment, a remote monitoring and control system for an electrical power system includes a control/communication module and a test apparatus. The test apparatus includes electrical power system test components coupled in or to an automatic transfer switch of the electrical power system and the control/communication module. The electrical power system test components are operable by the control/communication module to test one or more functions of the electrical power system.

In one embodiment, a method of assessing a backup power system includes: coupling electrical power system test components to an automatic transfer switch of the backup power system; communicatively coupling the electrical power system test components to a control/communication module; and operating the electrical power system test components to measure or test conditions in the backup power system.

Figure 1:
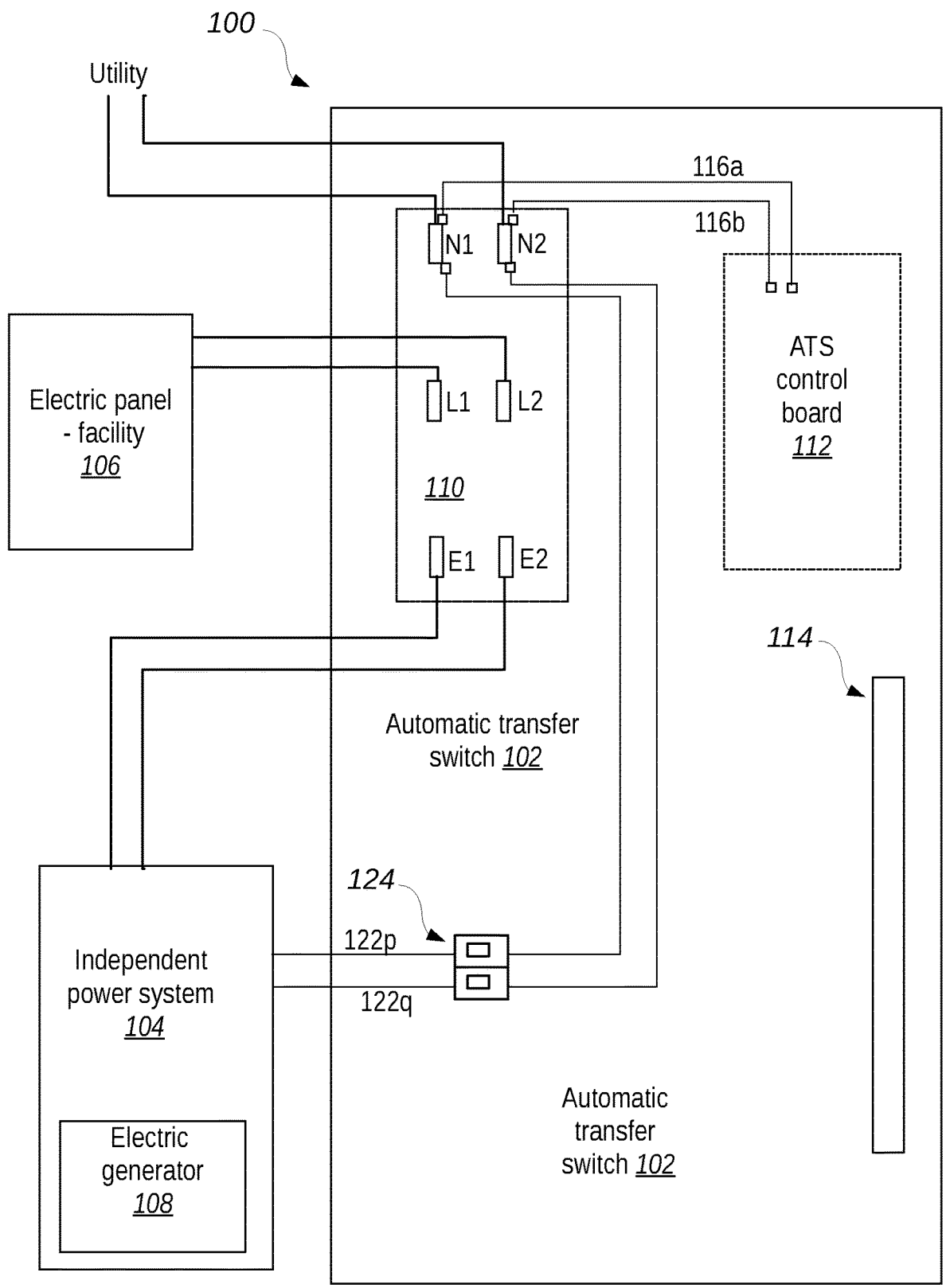
FIG. 1 illustrates a backup power system with an automatic transfer switch.

While the invention is described herein by way of example for several embodiments and illustrative drawings, those skilled in the art will recognize that the invention is not limited to the embodiments or drawings described. It should be understood that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF ILLUSTRATIVE EMBODIMENTS

Described herein are various embodiments of backup power systems and a remote monitoring and control system ("RMCS") that can be used for controlling, monitoring, assessing, and testing electrical power systems. The RMCS may seamlessly provide 24/7 monitoring coverage and control capabilities to undertake the functions described herein, as well as other functions relating to system performance and reliability.

An ATS component of an IEGS provides an alternate emergency power supply to the utility source of a home or facility. In various embodiments, the RMCS system allows a facility owner or an operator—solely via the ATS—to wirelessly monitor and control the IEGS's vital functions from a remote site or from a handheld terminal. Apparatus as described herein may include electro-mechanical components and a wireless communication module that are connected to the ATS power and control lines and to the facility's communication systems.

In various embodiments, the RMCS system as described herein may provide some or all of the following functions:

(i) continuously measure and record the voltage and frequency readings of each of the Line (Utility), Emergency (EGS) and Load (Facility) legs ("Leg");

(ii) cause the IPS to start, produce and send power to the ATS, automatically and/or in response to an operator command.

(iii) "simulate" a Utility failure and, in addition to causing the action in (ii) above to occur, to further cause the IEGS's ATS mechanism to switch the load source from Utility to IPS power, (iv) continuously monitor the flow control between the systems' communication module and the remote terminal to insure an uninterrupted "handshake";

(v) alert the operator of any Utility power outages or system failures, for example, after executing the operations in (ii) or (iii) or (iv) above, or during the facility's scheduled weekly/other self-test or during and after an actual power failure;

(vi) enable the monitoring and transmission data and testing control capabilities described in (i)-(v) above to be available to the operator in real time via a web-based application;

Functions (i) through (vi) may be referred to herein collectively as "Functions".

In some embodiments, a remote monitoring and control system ("RMCS") seamlessly provides 24/7 monitoring coverage and control capabilities to undertake the Functions. The RMCS provides the peace of mind that any missed self-test cycles, faults, or anomalies in the IEGS' performance will be instantaneously reported and remedied in a timely manner, well in advance of any Utility power failure. The RMCS as described herein may vastly improve an IEGS operator's customer service and client retention through better remote testing and troubleshooting solutions, as well as through real time diagnostics and performance data which save on the cost of service, maintenance, and repair work that can now be done less frequently and in a more targeted and efficient manner.

RMCS as described herein may operate in a comprehensive and inter-dependent manner. An RMCS may be designed to seamlessly handle the some or all of the Functions, as well as other functions. In some embodiments, the RMCS is hardwired via the ATS only without connecting directly to any circuit control boards in the ATS or the IPS, and without altering any exiting electro-mechanical components. Further, an RMCS connects to the facility's land lines and/or wireless (including cellular) network or internet connections for communications. In certain embodiments, an RMCS is Bluetooth-enabled for handheld terminals communication within the facility.

In some embodiments, the RMCS is universal, e.g., the RMCS can be retrofitted and connected to any new or existing ATS, irrespective of manufacturer's brand/model, type (open or closed transition, smart or dumb switch), or specifications (Voltage, Phase, Poles, Wiring etc.)

FIG. 1 illustrates a backup power system including an automatic transfer switch. Backup power system 100 includes automatic transfer switch 102 and independent power system 104. System 100 receives power from the utility and supplies it to electrical loads in a facility (e.g., a commercial building, residence, factory, hospital, or other facility) via electric panel 106.

Independent power system 104 includes electric generator 108. Electric generator 108 generates electricity for use by loads at the facility in the event of a power failure of utility power.

Automatic transfer switch 102 includes switching device 110, ATS control board 112, and ground bus bar 114. ATS control board 112 may provide signals to switching device 110 to control operation of automatic transfer switch 102.

Under normal conditions, switching device 110 enables power on terminal N1 and N2 to be supplied from Utility to electric panel 106 by way of terminal L1 and L2. Each of N1 and N2 may be a separate "hot" leg of a multileg power system. During normal operation, terminal L1 may be switched to terminal N1 and terminal L2 may be switched to terminal N2. System 100 may also include a neutral conductor (omitted from FIG. 1 for clarity) and ground conductor (also omitted for clarity) terminating on ground bus bar 114.

In the event of a failure of the utility feed, automatic transfer switch 102 may control switching device 110 such that terminal L1 is switched to hot leg E1 and terminal L2 is switched to hot leg E2, thereby enabling system 100 to supply power from independent power system 104 to electric panel 106.

Automatic transfer switch 102 includes sensing conductor pair 116a and 116b between N1/N2 and ATS control board 112. Automatic transfer switch 102 also includes generator start wire pair 122p and 112q, coupled between N1/N2 and independent power system 104. Generator start wire pair 122p and 112q may be used for triggering start-up of generator 108 of independent power system 104. Each of the lines in start wire pair 122p and 122q include a fuse 124 (e.g., a 10 amp fuse).

Some illustrative systems and methods for performing the various Functions are described below. Various systems may include adding components, as well as modification or retrofitting existing components (e.g., augmenting or retrofitting components in or to an automatic transfer switch) of a system such as the one shown in FIG. 1.

Function (i).

Figure 2:
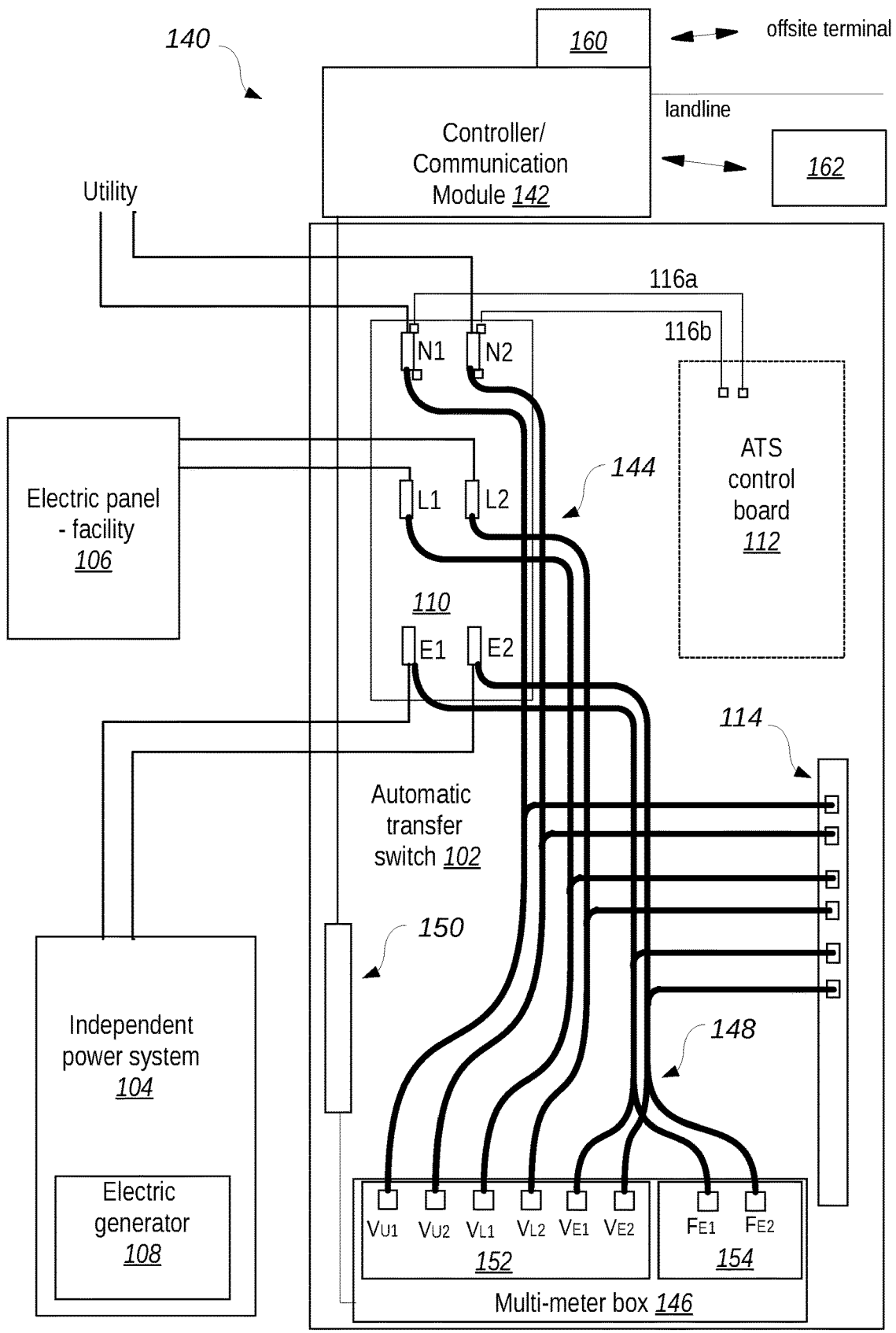
FIG. 2 illustrates one embodiment of an electrical power system having a remote monitoring and control system with a multi-meter box for monitoring voltage and frequency in the electrical power system.

FIG. 2 illustrates one embodiment of an electrical power system having a remote monitoring and control system with a multi-meter box for monitoring voltage and frequency in the electrical power system. System 140 may be configured to measure the voltage and frequency of each Leg in ATS 102 (6 or 9 contacts, depending on the number of phases). System 140 includes a backup power system (which may be as described above relative to FIG. 1), controller/communication module 142, and test apparatus 144. Test apparatus 144 includes multi-meter box 146, and jumper test wires (in this case, implemented by way of cable assembly 148) that are connected to each Leg and to the ground bar 114 on one end (Terminals), and to a voltage and frequency multi-meter MM-Box 146 on the other end. The jumper test wires are much safer and more functional than high voltage wires and each includes 2 wire leads and connectors on each end. (MM-Box 146 includes voltmeter unit 152 and frequency meter unit 154). The two Terminals end connectors are tapped onto the lug of each Leg and to the ground (or to the neutral) bar, and the two other end connectors are wrapped/fitted to the voltmeter and the frequency meter pins in MM-Box 146. MM-Box 146 is equipped with a PCB with an analog—digital circuit and an AC to DC voltage step-down circuit 150 such that the wires out of the MM-Box are low voltage DC (DC-Wires). The DC-Wires relay the voltage and frequency measurements from MM-Box 146 to controller/communication module, CCM 142, installed outside ATS 102. In certain embodiments, a meter includes optocoupler devices. The optocoupler devices may be used for measurement of differential voltages in the system.

CCM 142 may be connected to the facility's land line and/or to the internet connection/router and/or cellular network and has a built-in PCB and a communications module with a transceiver 160 for two-way data transfer between CCM 142 and an off-site operator. CCM 142 may be Bluetooth-enabled and can communicate with a paired hand-held terminal 162 at the facility. In certain embodiments, an interface is provided between CCM 142 and a user of the facility, such as the owner of a home to which the system is supplying back-up power.

In some embodiments, components of a testing and monitoring system (including, for example, MM-Box 146, CCM 142, and/or test apparatus 144, or some or all of the components thereof) are housed in an enclosure in or adjacent to an ATS enclosure. In certain embodiments, some or all of the apparatus' components are openly visible or included in a separate waterproof enclosure. Such enclosure and/or components may be installed in or out of the ATS.

Function (ii. a.)

Figure 3:
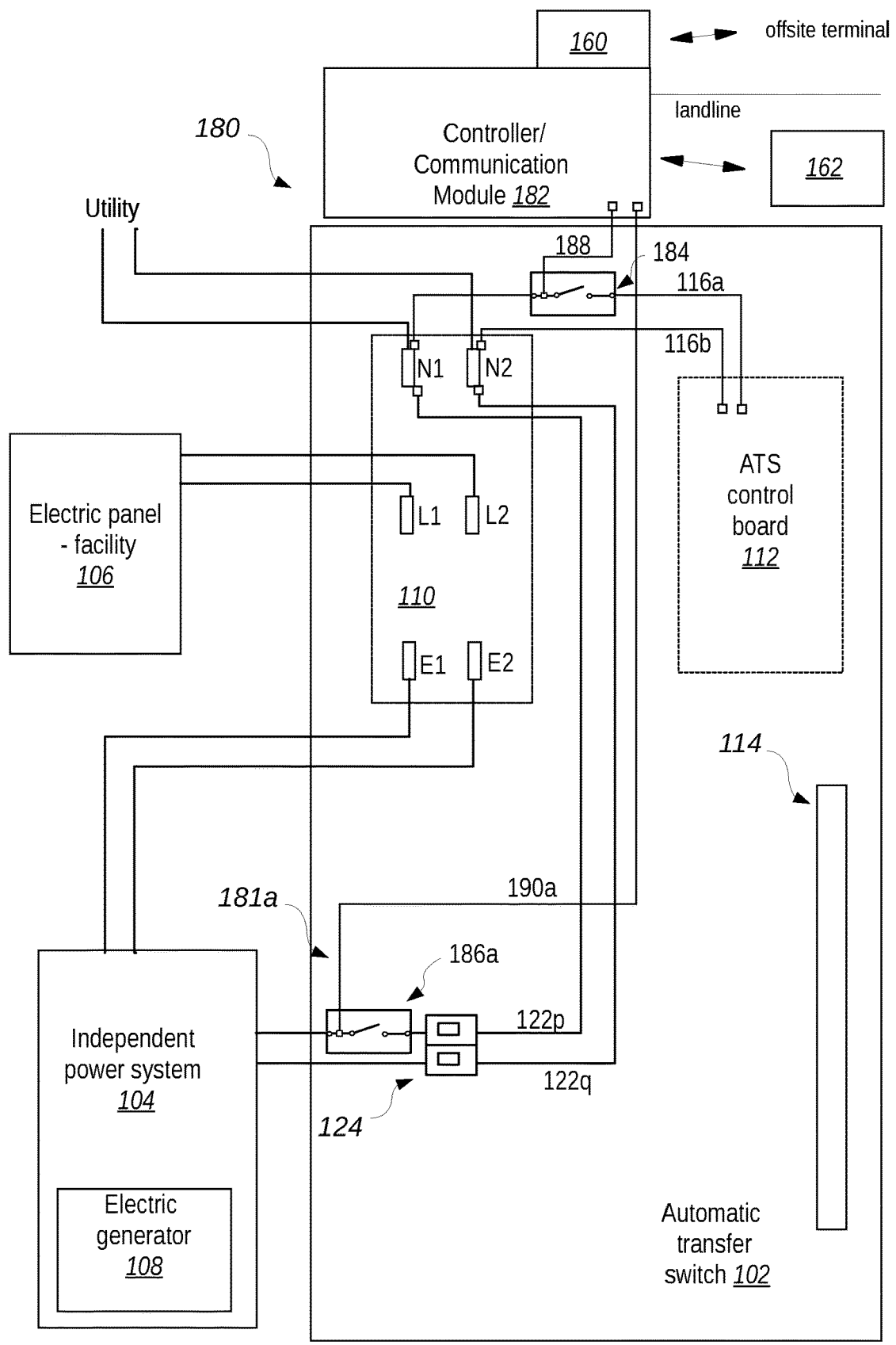
FIG. 3 illustrates one embodiment of an electrical power system having a remote monitoring and control system that can be used to test a backup power system and simulate failure conditions of the power system.

FIG. 3 illustrates one embodiment of an electrical power system having a remote monitoring and control system that can be used to test a backup power system and simulate failure conditions of the power system. System 180 may be configured to wirelessly cause the IEGS 104 to start, produce and send power to ATS 102. System 180 includes a backup power system (which may be as described above relative to FIG. 1), controller/communication module 182, and test apparatus 181a. (This embodiment is applicable only to ATSs that use voltage-carrying start wires. Note: ATSs using dry contact start wires are discussed in the next embodiment (Function ii. b.). In certain embodiments, test apparatus 181a may also include volt and frequency monitoring apparatus, such as described above relative to FIG. 2.

The apparatus in this embodiment includes a fused solid state normally-closed relay, NCR 186a, with a low voltage control wire attached to it. In some embodiments, NCR 186a is retrofitted to a production ATS. NCR 186a is installed in ATS 102, wired in line (spliced onto) either one of the two current carrying generator start wires 122p or 112q going from ATS 102 to the IPS. The low voltage control wire 190a attached to NCR 186a is connected on the other end to a control pin in CCM 182 that, in response to a signal, energizes and opens the NCR 186a. Opening the NCR 186a causes that start wire to lose its voltage and the sensor in the IPS circuit board will read a false start signal and cause the IPS circuit board to initiate the IPS to start. (It is noted that this (energizing) process is reversible and is initiated either in response to a user or operator command or automatically under certain conditions described elsewhere.)

Energizing the relays (in this Function, as well as other functions described below) may be executed by sending a low voltage current to the relay to change its status, following a signal sent via CCM 182's communication module/transceiver to the particular relay pin.)

Function (ii. b.)

Another embodiment is additionally configured to wirelessly cause the IPS to start, produce and send power to the ATS. This embodiment is applicable only for ATSs that use dry contact (no voltage) start wires.

Figure 4:
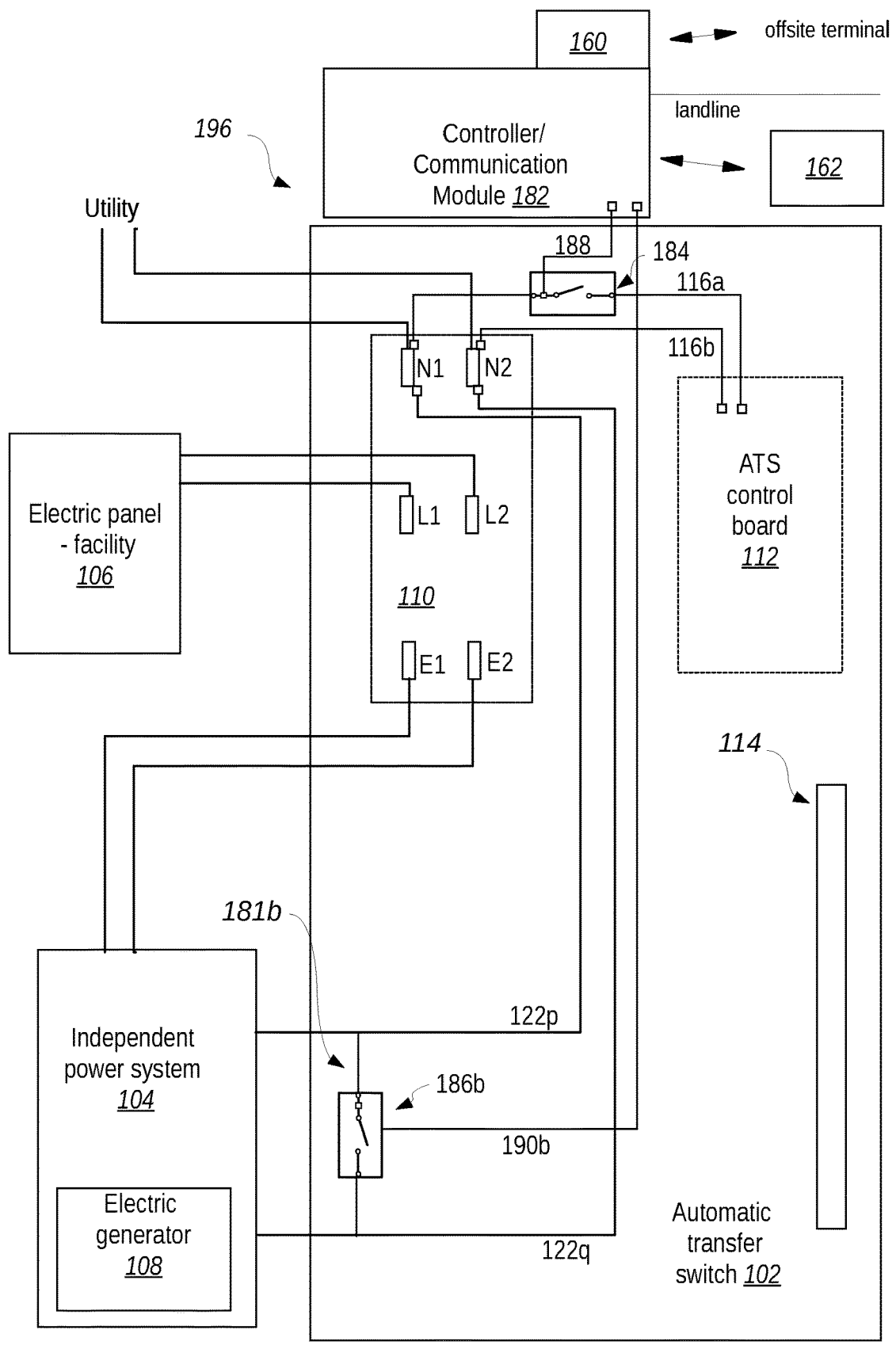
FIG. 4 illustrates one embodiment of an electrical power system having a remote monitoring and control system that can be used to test a backup power system having an automatic transfer switch with dry contact start wires, and to simulate failure conditions of the power system.

FIG. 4 illustrates one embodiment of an electrical power system having a remote monitoring and control system that can be used to test a backup power system having an automatic transfer switch with dry contact start wires, and to simulate failure conditions of the power system. System 196 includes test apparatus 181b. Test apparatus 181b includes a fused solid state normally open relay (NOR), NOR 186b with a low voltage control wire attached to it. In some embodiments, NOR 186b is retrofitted to a production ATS 102. NOR 186b is installed in the ATS, and wired as a "jumper" between the 2 dry contact start wires 122p and 122q going from the ATS 102 to the IPS. The low voltage control wire 190b attached to NOR 186b is connected on the other end to a control pin in the CCM 182 that, in response to a signal, energizes and closes the NOR. Closing the NOR causes the 2 dry contact wires to touch and the sensor in the IPS circuit board will read a false start signal and cause the IPS circuit board to initiate the IPS to start. It is noted that this (energizing) process is reversible and is initiated either in response to a user or operator command or automatically under certain conditions described elsewhere.

Function (iii.)

In some embodiments, a system is configured to wirelessly "simulate" a Utility power failure that would, in addition to initiating Function ii a. or ii b., further cause the ATS mechanism to automatically switch the load source from Utility to IPS power, after confirming acceptable parameters from the IPS power. (Note: A "simulated" power failure causes the EGS to activate and transfer power, exactly as what happens when the normal utility source is lost due to a real power outage or to other causes (blown fuse, burnt wire etc.)).

Referring again to FIG. 3, test apparatus 181 of system 180 further includes a fused solid state normally-closed relay, NCR 184, with a low voltage control wire 188 attached to it. In some embodiments, NCR 184 is retrofitted to a production ATS. NCR 184 may be installed in ATS 102, wired in-line (spliced onto) either one of the current-carrying sensing wires 116a or 116b connected between the Utility power source and the Utility sensors pins in the main circuit board 112 which monitors and controls the ATS functions, including remote starting the IPS and transferring power back and forth. The low voltage control wire 188 attached to the NCR 184 is connected on the other end to a control pin in CCM 182 that, in response to a signal, energizes and opens NCR 184. Opening NCR 184 causes that sensing wire to lose its voltage and that sensor in ATS 102's circuit board 112 will read a false Utility power loss and, as a result, cause the circuit board 112 to signal the IPS to start and allow the transfer mechanism 110 to switch over to IPS power. (It is noted that this (energizing) process is reversible and is initiated either in response to a user or operator command or automatically under certain conditions described elsewhere.).

Assessment, Testing, and Monitoring of a System

In an embodiment, a method of assessing a backup power system includes: coupling one or more electrical power system test components to an automatic transfer switch of the backup power system; communicatively coupling at least one of the electrical power system test components to a control/communication module; and operating at least one of the electrical power system test components to measure or test conditions in the backup power system; and controlling, in response to the measurements or test of conditions, by at least one signal or data sent from the control/communication module to the electrical power system test components in the automatic transfer switch, operation of the backup power system. The method may include measuring at least one voltage of power in the automatic transfer switch; measuring at least one frequency of power in the automatic transfer switch; and controlling, in response to frequency and voltage measurements over a period of time, operation of the backup power system.

In one embodiment, a method of assessing a backup power system includes coupling one or more relays to an automatic transfer switch of the backup power system; communicatively coupling at least one of the relays to a control/communication module; and operating at least one of the relays coupled to the automatic transfer switch to measure or test conditions in the backup power system. The relays may be retrofitted to the automatic transfer switch. In one embodiment, startup of a generator in the backup power system is triggered by the control/communication module sending a signal to one of the relays.

In various embodiments, a remote control/communication module controls and tests an IPS using a test apparatus in the ATS and signals or data transferred between an ATS and the remote module. In certain embodiments, an IPS is controlled solely by signals and data between and remote control module and an automatic transfer switch.

In some embodiments, the remote system monitors, through a connection to test apparatus connected in or to an ATS, output of a backup power source over time. The remote system may, in certain embodiments, assess whether the IPS has produced power (and/or produced power with acceptable characteristics). Measurements (e.g., voltage and or frequency measurements) may be taken once or on multiple occasions over a period of time. In some embodiments, the remote system determines whether the IPS has completed an acceptable self-exercise cycle within a certain interval. If not, the remote system may control the IPS, through signals between the remote system and the ATS, to start up a generator of the IPS and/or conduct testing of the IPS>

In some embodiments, a back-up power test apparatus or control system responds to the outcome of the test to alter parameters of testing, either at the time of the results or at a later time. For example, if voltage is out of a predetermined range, a test of the back-up system and/or ATS may be commenced. In some embodiments, a system uses machine learning or artificial intelligence to control testing.

In some embodiments, a back-up power test apparatus or control system uses artificial intelligence techniques, such as machine learning or pattern recognition techniques, to identify optimization opportunities and/or implement optimization of back-up system or ATS test or control procedures. In certain embodiments, historical data is used to improve its effectiveness over time, e.g., using various artificial intelligence techniques. In one embodiment, the system responds to measurements using artificial intelligence techniques by turning on the generator of a back-up power system.

In some embodiments, a test sequence and/or other test parameters are determined based on measurements of voltage and frequency in the back-up power system. The determination of the test sequence may depend, for example, on a frequency, voltage, or both staying within predetermined ranges. The test sequence or other parameters may be altered during or between tests.

In some embodiments, a test sequence is initiated by the system if the generator of the back-up power system does not kick in within a predetermined amount of time.

In various embodiments, a system such as described herein with respect to FIGS. 2 through 4 includes a remote test unit that controls testing as described above. The remote test unit may operate by a wired connection, wireless connection, or a combination thereof. In some embodiments, the remote connection with a back-up system is accomplished solely by a connection between a remote test control unit and an automatic transfer switch.

The following is illustrative of testing and assessment procedures that can be used in various embodiments. Testing of the system Functions (ii.) and (iii.) can occur either in response to an operator command or automatically following certain conditions/parameters, including, but not limited to, those described below.

Example of Test Procedure

The following conditions, when normal utility power is available, will trigger automatic testing of the system, and will turn on and run the IPS for 15 minutes without load transfer (Function (ii)):

1. No IPS power measured (No voltage on E1 or E2) for more than 169 hours (7 days+1 hour), indicating that the IPS has missed its scheduled weekly self-test exercise cycle. For bi-weekly cycles, the parameter time changes to 337 hours (14 days+1 hour).
2. If, between 167 and 169 hours (or 335 and 337 hours for bi-weekly self-test cycle) since the last power measurement, the IPS power (voltage on E1 and E2) is measured acceptable for less than continuous 5 minutes, indicating that the IPS did not fully and continuously complete its scheduled self-test exercise cycle.

The following condition will trigger a 15-minute automatic testing (condition 1 below) or open-ended emergency starting (conditions 2 and 3 below) of the system, and turn on and run the IPS with load transfer (Function (iii)):

1. If the IPS voltage and frequency power are measured and found to be, for more than 30 seconds, less than 20% and 5%, of rating, respectively, indicating that the ATS's switchgear mechanism is unlikely to allow the transfer from Utility to IPS power.
2. In the event an actual power failure has occurred and the IPS did not turn on after 5 minutes, then the ATS will initiate the IPS to start and will transfer power until power is restored.
3. In the event an actual power failure has occurred and the IPS did turn but the ATS did not transfer power, then Function ((iii)) will be initiated to attempt to remotely troubleshoot and force the ATS mechanism to transfer in case the issue lies with the ATS circuit board Utility sensors.

Function (iv).

This function of the RMCS is to monitor the continuity and data flow control between the CCM's communication module and the remote terminal to insure an uninterrupted "handshake". This may be accomplished via standard available protocol.

Function (v).

This function alerts the operator of any Utility power outages or system failures such as, for example, after executing the operations in (ii) or (iii) or (iv) or during the facility's scheduled weekly/other self-test or during and after an actual power failure. Examples of this include, but are not limited to, if the IPS is still running for no apparent reason (when Utility is available) either longer than the scheduled exercise time or long past the cool down period after Utility power has been restored following an actual outage.

Although, in the examples described above, monitoring and testing procedures has been described with specific times and other parameters, it will be understood that the parameters (such as times, intervals between tests, durations of tests, sequence) may be different in various embodiments. In addition, other test procedures and variations may be implemented using the RMCS. For example, different conditions may be used to trigger various monitoring, simulation, and test conditions. Also, test and monitoring steps may be omitted or added and/or the order of test procedures changed.

In various embodiments, a retrofit of an automatic transfer switch includes installing one or more components inside a housing of an automatic transfer switch. The automatic transfer switch may be opened up to provide access for installation of the new components and connection to existing components of the ATS. In some case, installed components are secured to the interior of the ATS.

In some embodiments, a relay is installed in-line in a conductor in the ATS. For example, a wire conductor may be broken to allow for in-line connection of the relay at the break of the wire. Modification to install components of the backup test system may not involve or require any contact or modification of the control circuit board or other existing circuit boards in the ATS.

Although, in various embodiments described above, a relay installed as a test component is a fused solid-state relay, it will be understood that the type of relay used may be different in various embodiments. For example, in certain embodiments, an electro-mechanical relay may be used in place of the solid-state relay described above.

Although, in various embodiments described above, a backup power system is implemented in a single-phase system, it will be understood that in some embodiments, monitoring, control, and testing systems such as those described herein may be implemented in three-phase systems. In a three-phase power system, for example, a retrofitted in-line relay (such as relay 184 described above relative to FIG. 3) may be placed in-line of a conductor on an "A" hot leg to simulate a loss of power in an A-B power circuit.

A "facility" includes any facility or other physical structure or combination of structures in which persons reside or conduct activities. Examples of a facility include an office building, residence, hospital, retail store, airport, factory, school, park, sports venue, entertainment venue.

A "backup power system" includes any system that can supply backup power to a load. A backup power system includes an emergency power system.

An "electric power source" includes a system, device, or apparatus that can supply electric power to a load. As used herein, an "electric power source" is independent from the electric power source and can supply power when the main (e.g., utility) power is lost.

A "test component" includes a system, device, or apparatus that can be operated or used to test or assess conditions of a system.

In various embodiments, a backup power system may include, or be included as part of, a computer system or computing device. Computer systems and computing devices may, in various embodiments, include components such as a CPU with an associated memory medium such as a solid-state storage device or Compact Disc Read-Only Memory (CD-ROM). The memory medium may store program instructions for computer programs. The program instructions may be executable by the CPU. Computer systems may further include a display device such as monitor, an alphanumeric input device such as keyboard, and a directional input device such as mouse. Computer systems may be operable to execute the computer programs to implement computer-implemented systems and methods. A computer system may allow access to users by way of any browser or operating system.

Computer systems and computing devices may include a memory medium on which computer programs according to various embodiments may be stored. The term "memory medium" is intended to include an installation medium, e.g., Compact Disc Read Only Memories (CD-ROMs), a computer system memory such as Dynamic Random Access Memory (DRAM), Static Random Access Memory (SRAM), Extended Data Out Random Access Memory (EDO RAM), Double Data Rate Random Access Memory (DDR RAM), Rambus Random Access Memory (RAM), etc., or a non-volatile memory such as a magnetic media, e.g., a hard drive or optical storage. The memory medium may also include other types of memory or combinations thereof. In addition, the memory medium may be located in a first computer, which executes the programs or may be located in a second different computer, which connects to the first computer over a network. In the latter instance, the second computer may provide the program instructions to the first computer for execution. A computer system may take various forms such as a personal computer system, mainframe computer system, workstation, network appliance, Internet appliance, television system or other device. In general, the term "computer system" may refer to any device having a at least one processor that executes instructions from a memory medium.

The memory medium may store a software program or programs operable to implement embodiments as described herein. The software program(s) may be implemented in various ways, including, but not limited to, procedure-based techniques, component-based techniques, and/or object-oriented techniques, among others. For example, the software programs may be implemented using ActiveX controls, C++ objects, JavaBeans, Microsoft Foundation Classes (MFC), browser-based applications (e.g., Java applets), traditional programs, or other technologies or methodologies, as desired. A CPU executing code and data from the memory medium may include a means for creating and executing the software program or programs according to the embodiments described herein.

A computer system may include, and/or may be implemented as, multiple functional modules or components, with each module or component including one or more resources (e.g., computing resources, storage resources, database resources, etc.). A system may include more or fewer components or modules, and a given module or component may be subdivided into two or more sub-modules or sub-components. Also, two or more of the modules or components can be combined.

Control, monitoring, and testing devices for backup power systems as described above, such as CCM 182, may be accessed, monitored, operated, and/or controlled by way of networks, such as the Internet, also referred to as the World Wide Web (WWW), an intranet and/or a wireless network, such as a cellular telephone network, a wireless local area network (LAN) and/or a metropolitan area network (MAN), and other devices by wireless communication.

The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. A remote monitoring and control system for an electrical power system, comprising:
   a control/communication module; and
   test apparatus comprising one or more electrical power system test components, wherein the at least one of the electrical power system test components are configured to couple in or to an automatic transfer switch of the electrical power system that maintains power to a load by switching the load from utility power to an independent backup power generation system when utility power fails, wherein the automatic transfer switch comprises a switching device that switches the load between utility power and the independent backup power generation system
   wherein at least one of the electrical power system test components is coupled to the control/communication module,
   wherein the at least one electrical power system test component is operable by the control/communication module to test one or more functions of the electrical power system, and
   wherein the remote monitoring and control system is configured to, in response to measurements of voltage or frequency in the electrical power system, automatically trigger startup of one or more components of the independent backup power generation system,
   wherein the electrical power system test components comprise at least one relay coupled in-line of a sensing conductor between, on the one hand, one of the input utility power lines of the automatic transfer switch and, on the other hand, a control board of the automatic transfer switch, wherein the sensing conductor is configured to connect the control board to the one of the utility power lines such that the control board senses an electrical characteristic of the utility power,
   wherein the remote monitoring and control system is configured to operate the control/communication module remotely over a network to open the at least one relay so as to break a connection in the sensing conductor between the input utility power line and the control board of the automatic transfer switch that switches the load between utility power and an independent backup power generation system to simulate a failure condition of the utility power, wherein the failure condition simulated is a failure of utility power that is normally supplied to the load, and in which, during the simulated failure, utility power to the switching device of the automatic transfer switch that switches the load between utility power and an independent backup power generation system is not interrupted,
   wherein simulation of the failure condition of the utility power is configured to cause automatic switching of the load from utility power to the independent backup power generation system even though utility power to the load and to the switching device of the automatic transfer switch has not been interrupted,
   wherein the automatic transfer switch is an existing production automatic transfer switch, wherein the at least one relay is retrofitted to the existing production automatic transfer switch by installing the relay in-line of one or more existing sensing wires between one of the input utility power lines of the existing production automatic transfer switch and a control board of the existing production automatic transfer switch.

2. The remote monitoring and control system of claim 1, wherein the electrical power system test components comprise a meter unit installed in the automatic transfer switch, wherein the meter unit is configured to measure voltage and frequency in the electrical power system.

3. The remote monitoring and control system of claim 1, wherein the electrical power system test components coupled to the automatic transfer switch comprise at least one additional relay, wherein the at least one additional relay is coupled in-line of a start wire for a generator of the independent backup power generation system, wherein the remote monitoring and control system is configured to operate the control/communication module remotely over a network to open the at least one additional relay to automatically trigger startup of the generator of the independent backup power generation system in response to a signal or data sent from the control/communication module to the automatic transfer switch.

4. The remote monitoring and control system of claim 3, wherein startup is in response multiple frequency measurements or multiple voltage measurements of the electrical power system over a period of time.

5. The remote monitoring and control system of claim 1, wherein the electrical power system test components coupled to the automatic transfer switch comprise at least one additional relay retrofitted into the automatic transfer switch, wherein the at least one additional relay is coupled in-line of a start wire for a generator of the independent backup power generation system, wherein the remote monitoring and control system is configured to operate the control/communication module remotely over a network to open the at least one additional relay to automatically trigger startup of the generator of the independent backup power generation system in response to a signal sent from the control/communication module to the automatic transfer switch.

6. A backup power system for a facility, comprising:
an independent backup power generation system;
an automatic transfer switch, wherein the automatic transfer switch comprises a switching device that switches the load between utility power and the independent backup power generation system; and
a backup power test system, comprising:
a control/communication module; and
a test apparatus comprising one or more electrical power system test components, wherein the at least one of the electrical power system test components are configured to couple in or to the automatic transfer switch, the automatic transfer switch comprising a switching device configured to switch between utility power and the independent backup power generation system;
wherein at least one of the electrical power system test components is coupled to the test control/communication module,
wherein the at least one electrical power system test components is operable by the test control/communication module to test one or more functions of the backup power system,
wherein the electrical power system test components comprise at least one relay coupled in-line of a sensing conductor between, on the one hand, one of the input utility power lines of the automatic transfer switch, and, on the other hand, a control board of the automatic transfer switch, wherein the sensing conductor is configured to connect the control board to the one of the utility power lines such that the control board senses an electrical characteristic of the utility power,
wherein the remote monitoring and control system is configured to operate the control/communication module remotely over a network to open the at least one relay so as to break a connection in the sensing conductor between the input utility power line and the control board of the automatic transfer switch to simulate a failure condition of the utility power, wherein the failure condition simulated is a failure of utility power that is normally supplied to the load, and in which, during the simulated failure, utility power to the switching device of the automatic transfer switch that switches the load between utility power and an independent backup power generation system is not interrupted,
wherein simulation of the failure condition of the utility power is configured to cause switching from utility power to the independent backup electric power source even though utility power to the load and to the switching device of the automatic transfer switch has not been interrupted,
wherein the automatic transfer switch is an existing production automatic transfer switch, wherein the at least one relay is retrofitted to the existing production automatic transfer switch by installing the relay in-line of one or more existing sensing wires between one of the input utility power lines of the existing production automatic transfer switch and a control board of the existing production automatic transfer switch.

7. The backup power system of claim 6, wherein at least one of the electrical power system test components comprises a multimeter unit communicatively coupled to the test control/communication module and electrically coupled to two or more sensing conductors of the automatic transfer switch,
wherein the multimeter unit is configured to measure at least one voltage and at least one frequency of power in the automatic transfer switch, wherein the multimeter unit is configured to provide information concerning the voltage and frequency to the test control/communication module.

8. The backup power system of claim 6, further comprising a relay operable to close and jump a pair of contacts to cause automatically the activation of the independent backup power generation system, wherein the control/communication module is configured to operate the relay operable to close and jump the pair of contacts.

9. The backup power system of claim 6, wherein the control/communication module is configured to open the at least one relay so as to simulate a power failure to cause automatically the activation of the independent backup power generation system and to trigger the automatic transfer switch to switch power from utility to the backup power system.

10. The backup power system of claim 6, wherein the control/communication module is remotely coupled to the automatic transfer switch over a communication network.

11. A method of assessing an independent backup power generation system, comprising:
retrofitting one or more relays in-line to one or more sensing conductors between, one the one hand, one of the input utility power lines of an automatic transfer switch and, on the other hand, a control board of an automatic transfer switch of the independent backup power generation system, wherein the sensing conductor is configured to connect the control board to the one of the utility power lines such that the control board senses an electrical characteristic of the utility power, wherein the automatic transfer switch is an existing production automatic transfer switch, wherein retrofitting at least one of the relays in-line to the one more sensing conductors comprises installing the relay in-line of one or more existing sensing wires between one of the input utility power lines of the existing production automatic transfer switch and a control board of the existing production automatic transfer switch;
communicatively coupling at least one of the one or more relays to a control/communication module; and remotely operating, over a network, at least one of the one or more relays that is retrofitted in-line to the one or more sensing conductors to measure or test conditions in the independent backup power generation system; and controlling, in response to the measurements or test of conditions, by way of at least one signal or data sent from the control/communication module to the at least one relay that is retrofitted in-line to the one or more sensing conductors between one of the input utility power lines of the automatic transfer switch and the control board of the automatic transfer switch, operation of the independent backup power generation system.

12. The method of assessing an independent backup power generation system of claim 11, wherein assessing the independent backup power generation system comprises opening the at least one relay to simulate a power failure in which utility power to the switching device of the automatic transfer switch is not interrupted to trigger startup of the electric generator of the independent backup power generation system and to cause the automatic transfer switch to switch power from utility to the independent backup power generation system.

13. The method of assessing an independent backup power generation system of claim 11, wherein assessing the independent backup power generation system comprises opening at least one of the relays to simulate a power failure to trigger startup of the electric generator of the independent backup power generation system.

14. The method of assessing an independent backup power generation system of claim 11, wherein assessing the independent backup power generation system comprises closing a relay to jump a pair of contacts to trigger startup of an electric generator of the independent backup power generation system.

15. The method of assessing an independent backup power generation system of claim 11, further comprising automatically testing the independent backup power generation system if a first set of criteria are met.

16. The method of assessing an independent backup power generation system of claim 15, further comprising automatically testing the independent backup power generation system if a second set of criteria are met.

17. The method of claim 11, further comprising retrofitting an additional relay to the automatic transfer switch, wherein retrofitting the additional relay comprises coupling the additional relay in-line of a start wire for a generator of the independent backup power generation system, and communicatively coupling the additional relay to the control/communication module such that the control/communication module is operable to open the additional relay to trigger startup of the generator of the independent backup power generation system.

18. The method of claim 11, wherein installing the relay comprises splicing the relay into the sensing wire.

19. The method of claim 11, wherein installing the relay comprises breaking the sensing wire to allow for in-line connection of the relay at the break of the sensing wire.

20. The method of claim 11, wherein installing the relay comprises opening up the existing production automatic transfer switch to provide access inside a housing of the existing production automatic transfer switch, and installing the relay inside the housing of the existing production automatic transfer switch.

21. A method of assessing an independent backup power generation system, comprising:

retrofitting one or more relays in-line to one or more sensing conductors between, on the one hand, one of the input utility power lines of an automatic transfer switch and a control board of an automatic transfer switch of the backup power system, wherein the sensing conductor is configured to connect the control board to the one of the utility power lines such that the control board senses an electrical characteristic of the utility power, wherein the automatic transfer switch is an existing production automatic transfer switch, wherein retrofitting at least one of the relays in-line to the one more sensing conductors comprises installing the relay in-line of one or more existing sensing wires between the one of the input utility power lines of the existing production automatic transfer switch and a control board of the existing production automatic transfer switch;

communicatively coupling at least one of the one or more relays to a control/communication module; and communicatively coupling the control/communication modules to one or more control devices over a network, remotely operating, by way of data transmitted over the network, at least one of the one or more relays that is retrofitted in-line to the one or more sensing conductors between one of the input utility power lines of the automatic transfer switch and the control board of the automatic transfer switch to measure or test conditions in the backup power system.

22. The method of claim 21, wherein operating the at least one of the one or more relays that is retrofitted in-line to the one or more sensing conductors in the automatic transfer switch comprises triggering startup of a generator in the independent backup power generation system by sending, by the control/communication module, a signal to the at least one relay.

* * * * *